(12) United States Patent
Du Bois et al.

(10) Patent No.: US 10,240,234 B2
(45) Date of Patent: Mar. 26, 2019

(54) GAS DISTRIBUTION APPARATUS FOR PROCESSING CHAMBERS

(71) Applicant: Applied Materials, Inc., Santa Clara, CA (US)

(72) Inventors: Dale R. Du Bois, Los Gatos, CA (US); Kien N. Chuc, Cupertino, CA (US); Karthik Janakiraman, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/489,306

(22) Filed: Apr. 17, 2017

(65) Prior Publication Data

US 2018/0237915 A1    Aug. 23, 2018

Related U.S. Application Data

(60) Provisional application No. 62/462,228, filed on Feb. 22, 2017.

(51) Int. Cl.
| | |
|---|---|
| *C23C 16/455* | (2006.01) |
| *C23C 16/50* | (2006.01) |
| *C23C 16/44* | (2006.01) |
| *H01L 21/02* | (2006.01) |

(52) U.S. Cl.
CPC .... *C23C 16/45559* (2013.01); *C23C 16/4412* (2013.01); *C23C 16/50* (2013.01); *H01L 21/0262* (2013.01); *H01L 21/02274* (2013.01)

(58) Field of Classification Search
None
See application file for complete search history.

(56) References Cited

U.S. PATENT DOCUMENTS

| | | |
|---|---|---|
| 5,571,560 A | 11/1996 | Lin |
| 7,654,224 B2 | 2/2010 | Zhao et al. |

(Continued)

FOREIGN PATENT DOCUMENTS

| | | |
|---|---|---|
| JP | 2004111857 A | 4/2004 |
| KR | 1020060135184 A | 12/2006 |
| WO | 2014073806 A1 | 5/2014 |

OTHER PUBLICATIONS

PCT/US2018/014852, International Search Report, dated Jun. 26, 2018, 3 pages.

*Primary Examiner* — Mounir S Amer
(74) *Attorney, Agent, or Firm* — Patterson + Sheridan LLP

(57) ABSTRACT

Implementations described herein generally relate to a method and apparatus for depositing material on a substrate. In one implementation, a processing chamber for processing a substrate includes a chamber body and a substrate support disposed within the chamber body and adapted to support the substrate thereon. The processing chamber includes a plurality of gas inlets positioned above the substrate support to direct a process gas above the substrate support. A movable diffuser is pivotally mounted adjacent the substrate support via a pivoting mount. The movable diffuser includes a deposition head having a plurality of inlet openings for directing process gas toward the substrate support and a plurality of exhaust openings for providing an exhaust to process gas disposed above the substrate support by the movable diffuser.

18 Claims, 5 Drawing Sheets

(56) References Cited

U.S. PATENT DOCUMENTS

| | | | |
|---|---|---|---|
| 2012/0186521 A1* | 7/2012 | Iwasaki | C23C 16/45517 |
| | | | 118/723 AN |
| 2013/0156940 A1 | 6/2013 | Wu et al. | |
| 2013/0284097 A1 | 10/2013 | Ranish et al. | |
| 2016/0115595 A1 | 4/2016 | Hwang et al. | |
| 2016/0273105 A1* | 9/2016 | de Ridder | C23C 16/4412 |
| 2016/0289831 A1 | 10/2016 | Je et al. | |

* cited by examiner

GAS DISTRIBUTION APPARATUS FOR PROCESSING CHAMBERS

CROSS-REFERENCE TO RELATED APPLICATIONS

This application claims benefit of U.S. Provisional Patent Application Ser. No. 62/462,228, filed on Feb. 22, 2017. The aforementioned application is herein incorporated by reference.

BACKGROUND

Field

Implementations described herein generally relate to semiconductor substrate processing systems. More specifically, the implementations relate to methods and apparatus for performing deposition processes in semiconductor substrate processing systems.

Description of the Related Art

In the fabrication of integrated circuits, deposition processes such as chemical vapor deposition (CVD) or plasma enhanced CVD processes are used to deposit films of various materials upon semiconductor substrates. Herein such processes are collectively referred to as CVD processes. After the CVD process has completed, the films are analyzed. The analysis oftentimes reveals that the material deposited on the surface of the substrate is non-uniform in thickness and other film properties, and therefore, negatively affects the performance of the final manufactured device.

Therefore, there is a need for an apparatus and method for improving deposition uniformity on substrates in processing chambers.

SUMMARY

Implementations described herein generally relate to an apparatus for and methods of depositing material on a substrate. In one implementation, the apparatus generally includes a processing chamber for processing a substrate. In one implementation, the processing chamber includes a chamber body having a substrate support disposed within the chamber body and adapted to support a substrate thereon. The processing chamber also includes a plurality of gas inlets to direct a process gas above the substrate support. The processing chamber further includes a movable diffuser pivotally mounted adjacent the substrate support via a pivoting mount. The movable diffuser has an arm process gas flow path leading to a plurality of inlet openings formed in the movable diffuser for directing process gas toward the substrate support, and an exhaust flow path leading to a plurality of exhaust openings formed in the movable diffuser for providing an exhaust to process gas disposed above the substrate support by the movable diffuser.

In another implementation, a processing chamber includes a chamber body and a substrate support disposed within the chamber body to support a substrate. A plurality of gas inlets is positioned above the substrate support to direct a process gas above the substrate support. The movable diffuser is mounted adjacent the substrate support. The movable diffuser has an arm process gas flow path leading to inlet openings in the movable diffuser for directing process gas toward the substrate support. The movable diffuser is rotatable to a plurality of operational positions with the inlet openings of the movable diffuser being positioned over a different area of the substrate support for each of the plurality of operational positions.

In another implementation, a processing chamber provides a method of processing a substrate in a processing chamber that includes rotating a movable diffuser to an operational position over a selected deposition area of the substrate. The movable diffuser has a plurality of inlet openings and a plurality of exhaust openings. The method includes injecting a process gas from the inlet openings of the movable diffuser onto the selected deposition area of the substrate during a deposition flow period. The method includes exhausting process gas injected from the inlet openings of the movable diffuser through exhaust openings in the movable diffuser during the deposition flow period. The method includes injecting an isolation gas from a plurality of gas inlets positioned above the substrate and above the inlet openings of the movable diffuser during the deposition flow period. The method includes exhausting isolation gas from the gas inlets through a vacuum port in a chamber body during the deposition flow period.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only selected implementations of this disclosure and are therefore not to be considered limiting of its scope, for the disclosure may admit to other equally effective implementations.

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Implementations described herein generally relate to an apparatus for and methods of depositing material on a wafer or substrate. The apparatus generally includes a CVD processing chamber such as a PECVD processing chamber. Herein either processing chamber may be referred to as a CVD processing chamber. The apparatus may include other processing chambers that are used for processing substrates. The processing chamber has a process gas region therein, and process gas is introduced into the process gas region through gas inlets. The processing chamber may also include a showerhead configured to provide process gas to the surface of the substrate to effect a uniform deposition of material on the substrate surface. The methods generally include injecting a process gas to a surface of a substrate, and thermally decomposing the process gas on the substrate. Additional process gas is provided through a movable diffuser to selected deposition areas of the surface of the substrate to effect a uniform deposition on the substrate surface.

Figure 1:
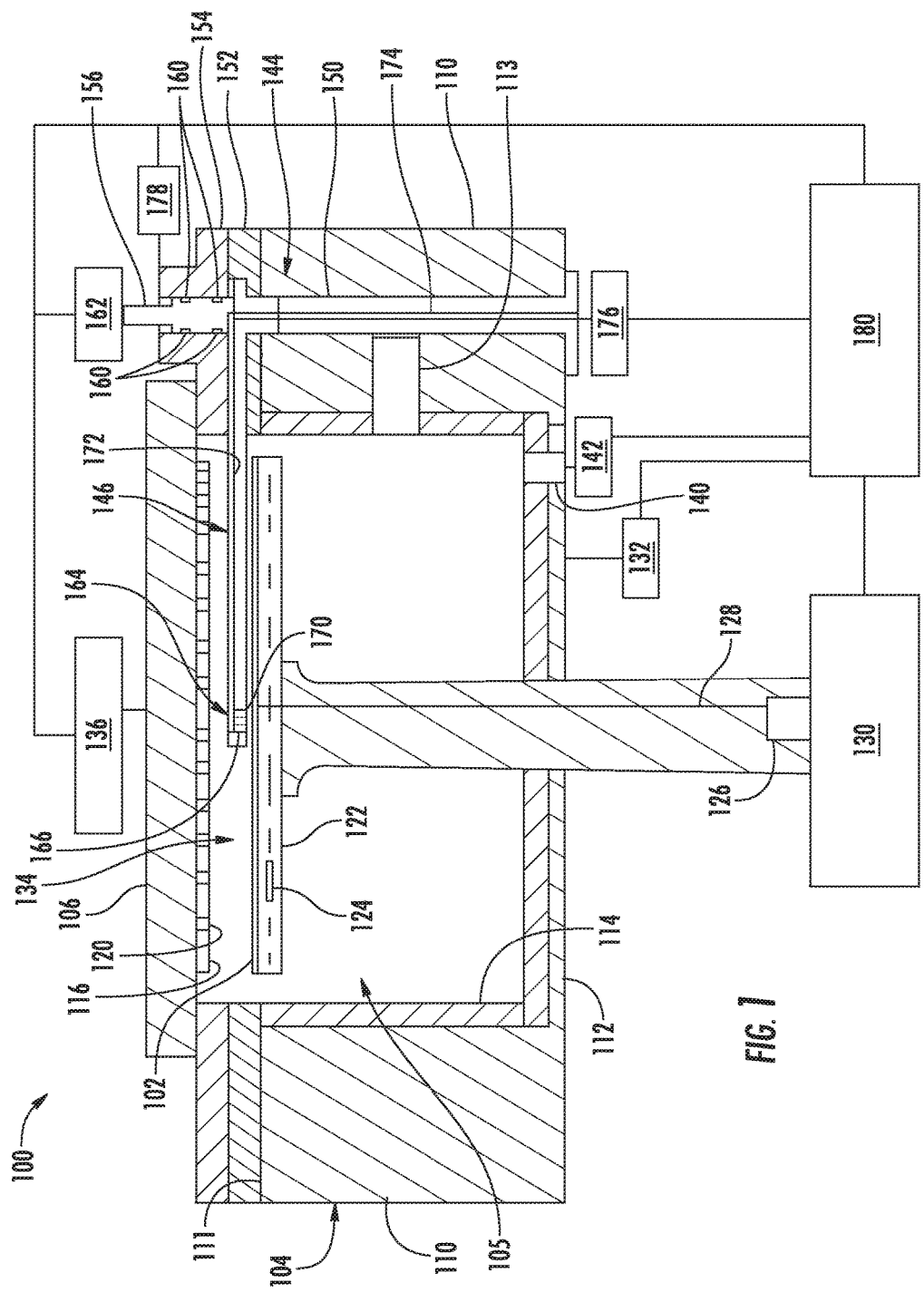
FIG. 1 depicts a schematic sectional view of a processing chamber according to one implementation.

FIG. 1 depicts a schematic cross section diagram of an implementation of a processing chamber 100. The images of FIG. 1 are simplified for illustrative purposes and are not depicted to scale. The processing chamber 100 may be used to process one or more substrates 102, including deposition of material on an upper surface of a substrate 102. The processing chamber 100 includes a chamber body 104 and a face plate 106 coupled to the chamber body 104. The face plate 106 may be referred to as a lid assembly. The chamber body 104 includes chamber side wall 110, bottom 112, and a chamber interior 105. Positioned in the chamber interior 105 is a liner 114 for protecting the chamber body 104. The face plate 106 includes a showerhead 116 with a plurality of gas inlets 120. A substrate support 122 adapted to support a substrate 102 thereon is disposed within the processing chamber 100 between the showerhead 116 and the bottom 112 of the chamber body 104. The substrate support 122 includes heating elements 124 to heat a substrate 102 supported on the substrate support 122 to a desired processing temperature. A power supply 126 is coupled to the heating elements 124 by a power line 128 to provide power to the heating elements 124.

The substrate support 122 is shown in an elevated processing position, but may be vertically positioned by a substrate support actuator 130 between the processing position and a loading position. The loading position for the substrate support 122 is below the processing position and allows the substrate 102 to be removed from the substrate support 122. A robot (not shown) may then enter the processing chamber 100 to engage and remove the substrate 102 therefrom through an opening (not shown) in the chamber side wall 110. The substrate support 122 is also adapted to be rotated during processing by the substrate support actuator 130 to facilitate uniform processing of the substrate 102. The processing chamber 100 comprises conventional systems for retaining and releasing the substrate 102, detection of an end of a process, internal diagnostics and the like. Such systems are collectively depicted in FIG. 1 as support systems 132.

The substrate support 122 while located in the processing position defines a process gas region 134 in the internal volume of the chamber body 104. The process gas region 134 includes the internal chamber volume located between the face plate 106 and the substrate support 122 while the substrate support 122 is located in the processing position.

Process gas supplied from a gas panel 136 is introduced into the process gas region 134 via the showerhead 116. More specifically, the gas panel 136 is coupled to the face plate 106 and the gas panel 136 supplies process gas into one or more gas chambers (not shown) in the face plate 106 to the showerhead 116 and then through gas inlets 120 in the showerhead 116 to the process gas region 134. The process gas flows to the upper surface of the substrate 102. Process gas is removed from the chamber through a vacuum port 140 and removal of the process gas is facilitated by a vacuum pump 142 coupled thereto. The gas panel 136 may also supply isolation or purge gas to the face plate 106.

FIG. 1 shows an implementation of a movable diffuser assembly 144 used to flow process gas on selected deposition areas of a substrate 102. The movable diffuser assembly 144 is mounted to the chamber body 104 and includes a movable arm or movable diffuser 146, support housing 150, arm housing 152, and arm cover 154. The movable diffuser 146 is pivotally mounted adjacent the perimeter of the substrate support 122. The support housing 150 is disposed in a channel in the chamber body 104, and extends from a bottom 112 of the chamber body 104 to an area adjacent to the chamber top surface 111 of the chamber body 104. The support housing 150 may be coupled to the chamber body 104 with bolts or otherwise conventionally attached. The movable diffuser assembly 144 may include a collar plate 158, shown in the implementation of FIG. 3A, as one of the components used to mount the movable diffuser 146 to the chamber body 104.

The arm housing 152 is attached to a chamber top surface 111 of the chamber body 104 and the arm cover 154 is attached to the arm housing 152 in a conventional manner such as by bolts. The arm housing 152 and arm cover 154 define an opening above the chamber side wall 110 of the chamber body 104 such that the movable diffuser 146 extends through and over the substrate support 122. The arm cover 154 has an arm cover top surface and the face plate 106 is supported by the arm cover 154 at the arm cover top surface so that the face plate 106 including the showerhead 116 is disposed over the movable diffuser 146. This allows the movable diffuser 146 to be positioned over the substrate support 122 while the face plate 106 is in an operation position such that the showerhead 116 is disposed over the substrate support 122.

The movable diffuser 146 includes an elongated arm section that extends from the support housing 150 and over the substrate support 122. The movable diffuser 146 is pivotally mounted to the support housing 150, and includes an upper section member 156 with seals 160 that provide a seal between the arm cover 154 and the upper section member 156. A rotary seal is used in an implementation to account for the rotation of the movable diffuser 146 when positioning the movable diffuser 146 at selected locations over the substrate support 122. In an implementation, a pressurized annular seal may be used. A pressurized gas supply 178 may be coupled to the seals 160 when a pressurized annular seal is used. In some embodiments, the vacuum pump 142 may be coupled to the seals 160 to provide the pressurized gas supply 178. A movable diffuser actuator 162 such as a servo motor is coupled to the movable diffuser 146 at the upper section member 156. The movable diffuser actuator 162 selectively rotates the movable diffuser 146 to position the movable diffuser 146 at selected locations over the substrate support 122 and substrate 102.

The movable diffuser 146 includes a deposition head 164 positioned at an end section of the movable diffuser 146 extending over the substrate support 122. The deposition head 164 includes a diffuser showerhead 166 having a plurality of inlet openings 170. The diffuser showerhead 166 and inlet openings 170 of the deposition head 164 are coupled to an arm process gas flow path 172 in the movable diffuser 146. The arm process gas flow path 172 in the movable diffuser 146 extends from the deposition head 164 along the length of the movable diffuser 146 and couples with a housing process gas flow path 174 in the support housing 150. A housing process gas flow path 174 of the support housing 150 is coupled to the diffuser process gas supply 176.

A controller 180 is used to control the operation of the processing chamber 100. The controller 180 is coupled to gas panel 136, movable diffuser actuator 162, pressurized gas supply 178, substrate support 122, substrate support actuator 130, and power supply 126. The controller 180 may include a storage memory, a processor, and input/output unit. The controller 180 controls the operation of the movable diffuser 146 and the positioning of the deposition head 164 of the movable diffuser 146 and the flow of process gas from the deposition head 164 over selected deposition areas of the substrate 102.

Figure 2:
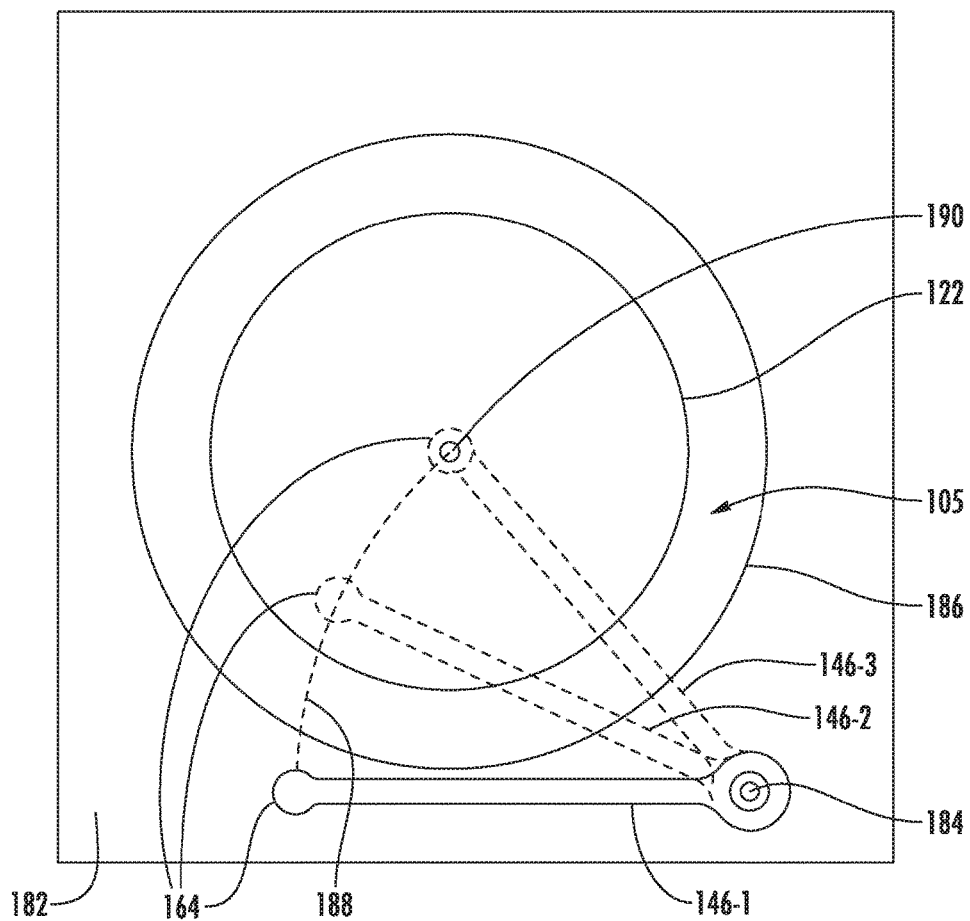
FIG. 2 depicts a simplified top view of a processing chamber illustrating positions of a movable diffuser according to one implementation.

In FIG. 2, a simplified top view of the movable diffuser 146 is shown for the purpose of describing the positioning of the movable diffuser 146. The image of FIG. 2 is simplified for illustrative purposes to show the positioning of the movable diffuser 146, and the face plate 106 and other components are not shown. The chamber body 104 has a top opening perimeter 186 that leads to the interior region 105 of the processing chamber 100. The movable diffuser 146 is pivotally mounted and rotates about a pivot point 184. The movable diffuser 146 is shown in three different positions in FIG. 2.

The movable diffuser 146 has a storage position that is used when the movable diffuser 146 is non-operational. When in the storage position, the movable diffuser 146 is shown in solid lines and labeled as 146-1 in FIG. 2. When in the storage position, the movable diffuser 146 is positioned outside of the top opening perimeter 186 so as to be positioned in an outer perimeter section 182 of the processing chamber 100 and to not overlie the interior region 105 of the processing chamber 100. When in the storage position, the movable diffuser 146 does not interfere with the operation of the showerhead 116 of the face plate 106 or with the removal of the liner 114 from the processing chamber 100 through the top opening of the chamber body 104. In an implementation, the movable diffuser 146 has a curved elongated section (see FIGS. 4A and 4B). This curved elongated section helps position the movable diffuser 146 so that it does not overhang the top opening perimeter 186 of the interior region 105 of the processing chamber 100.

The deposition head 164 of the movable diffuser 146 is movable to a center of the substrate support 122 along an arc path 188 by rotating the movable diffuser 146. The deposition head 164 is movable at any point on arc path 188. When the deposition head 164 is at the center position of the substrate support 122, the movable diffuser 146 is shown in dotted lines and labeled as 146-3. When the deposition head 164 is at an intermediate position between the storage position and the center position, the movable diffuser 146 is shown in dotted lines and labeled as 146-2. The controller 180 is used to send signals to the movable diffuser actuator 162 (shown in FIG. 1) to rotate the movable diffuser 146 and deposition head 164 to the selected locations. When positioned at the selected locations, the movable diffuser 146 deposits process gas to the substrate 102 on the substrate support 122 at the selected location in response to signals from the controller 180.

Figure 3A:
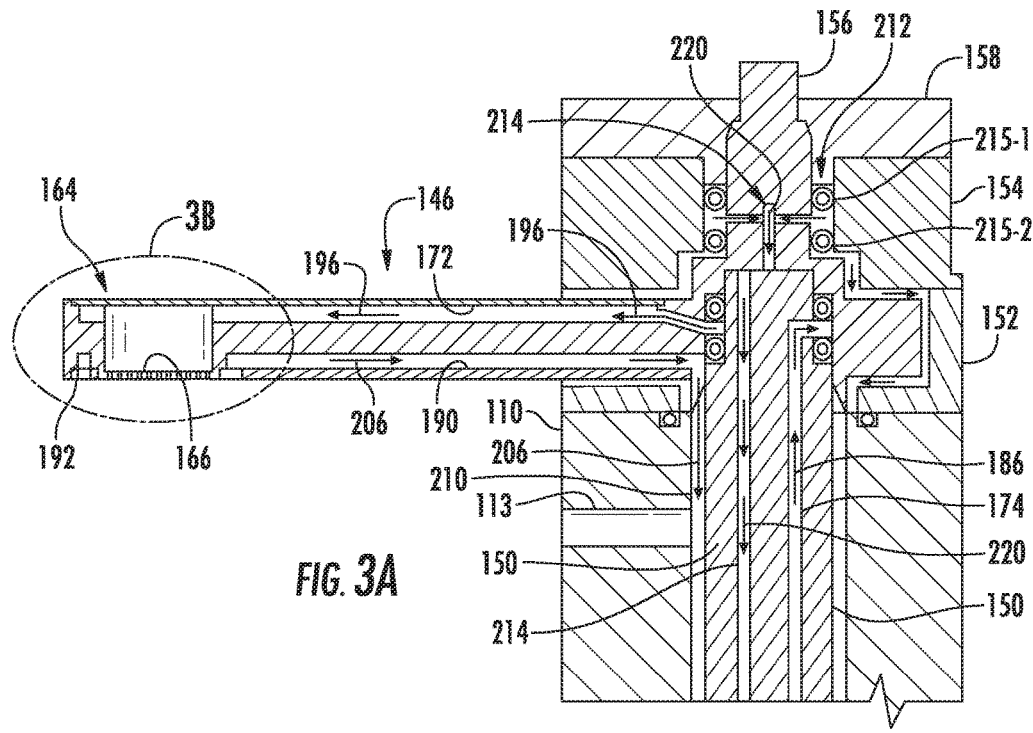
FIG. 3A depicts a schematic sectional view of a movable diffuser assembly according to one implementation.
Figure 3B:
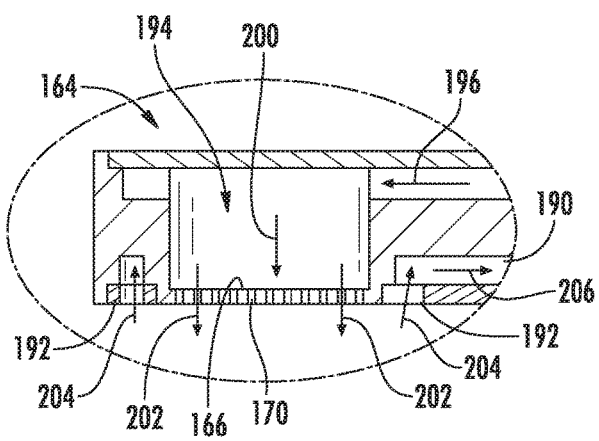
FIG. 3B depicts a schematic sectional view of a deposition head of a movable diffuser assembly according to one implementation.

In FIG. 3A and FIG. 3B, a schematic cross section of another implementation of the movable diffuser 146 is shown. The images of FIG. 3A and FIG. 3B are simplified for illustrative purposes and are not depicted to scale. In this implementation, the movable diffuser 146 has both an arm process gas flow path 172 and an arm exhaust flow path 190. Likewise, the deposition head 164 of the movable diffuser 146 includes both inlet openings 170 and exhaust openings 192. As shown in FIG. 3A, arm process gas flow path 172 and the arm exhaust flow path 190 extend along the elongated section of the movable diffuser 146 from the chamber side wall 110 of the chamber body 104 to the deposition head 164. The deposition head 164 includes a process gas chamber 194 coupled to the arm process gas flow path 172 in the movable diffuser 146. At the bottom of the process gas chamber 194 is a diffuser showerhead 166 having a circular shape with a plurality of inlet openings 170. Arrows 196 illustrates the flow of process gas through the arm process gas flow path 172 in the movable diffuser 146. Arrow 200 illustrates the process gas flow in the process gas chamber 194. Arrows 202 illustrates the flow of process gas through the inlet openings 170 in the diffuser showerhead 166.

The deposition head 164 of the movable diffuser 146 includes a plurality of exhaust openings 192 coupled to the arm exhaust flow path 190 of the movable diffuser 146. The plurality of exhaust openings 192 in the deposition head 164 are positioned around the perimeter of the diffuser showerhead 166 and inlet openings 170 and form a circular shape around the inlet openings 170. Arrows 204 illustrates the flow of exhaust through the exhaust openings 192 of the deposition head 164, and then into the arm exhaust flow path 190 of the movable diffuser 146 with the arrows 206 illustrating the flow of exhaust.

As shown in FIG. 3A, the support housing 150 of the movable diffuser assembly 144 includes a housing process gas flow path 174 within the support housing 150. The housing process gas flow path 174 of support housing 150 couples to the arm process gas flow path 172 in the movable diffuser 146. The arrows 196 illustrate the flow of process gas from the support housing 150 to the movable diffuser 146. Annular rotational seals 215-1 and 215-2 define a portion of the housing process gas flow path 174 in the support housing 150, and the process gas passes between annular rotational seals 215-1 and 215-2 before entering the arm process gas flow path 172 in the movable diffuser 146.

A housing exhaust flow path 210 is located in the annulus of the support housing 150 and the housing exhaust flow path 210 is defined by the support housing 150 and the chamber side wall 110 of chamber body 104. The support housing 150 may be cylindrical and sized to provide an annulus channel or housing exhaust flow path 210. The housing exhaust flow path 210 of the support housing 150 couples to a side wall opening 113 in the chamber side wall 110 of the chamber body 104. As shown in FIG. 1, side wall opening 113 connects to the chamber body interior 105 of the chamber body 104. Exhaust from housing exhaust flow path 210 flows through side wall opening 113, as illustrated by arrows 206, and into chamber body interior 105 where the exhaust flows through vacuum port 140. The vacuum pump 142 for the processing chamber 100 may provide vacuum suction for the arm exhaust flow path 190 of the movable diffuser 146 and the housing exhaust flow path 210 of the support housing 150. In other embodiments, the housing exhaust flow path 210 may be extended to connect with the vacuum pump 142 or an additional pump may be connected to the housing exhaust flow path 210 to generate a vacuum for the exhaust openings 192.

As shown in FIG. 3A, an implementation may have a differentially pumped seal system 212. In the differentially pumped seal system 212, pressurized gas is pumped from pressurized gas supply 178, see FIG. 1, to a differential pumping path 214 between annular rotational seals 215-1 and 215-2, and the pressurized gas then flows through the support housing 150. Gas flow in the differential pumping path 214 is shown by arrows 220. The pressurized gas provides a pressure seal for the annular rotational seals 215-1 and 215-2.

Figure 4A:
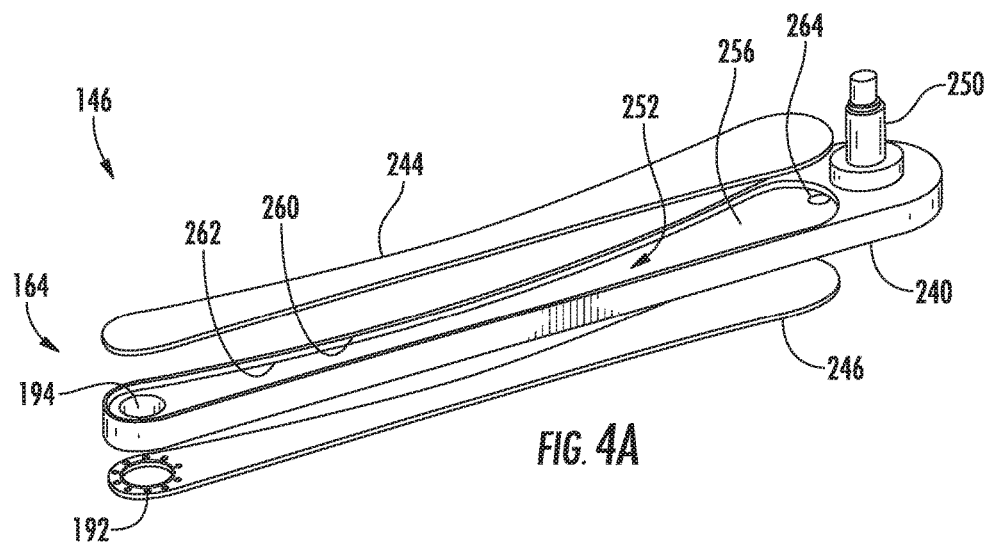
FIG. 4A depicts a top perspective schematic exploded view of a movable diffuser according to one implementation.
Figure 4B:
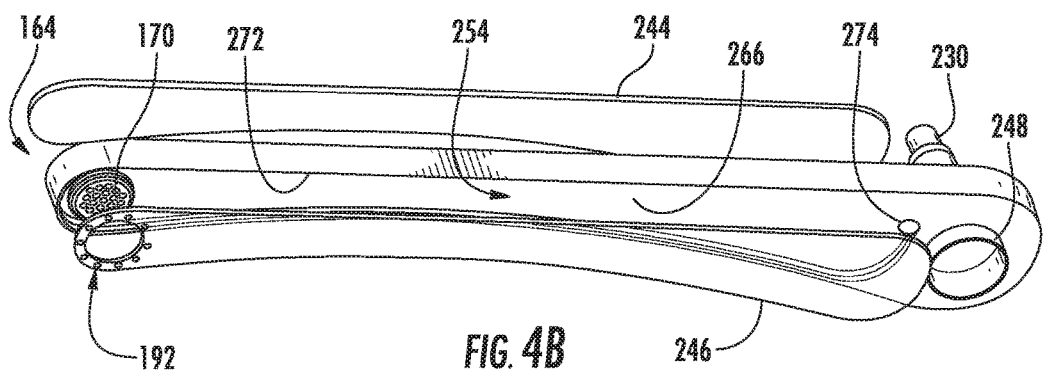
FIG. 4B depicts a bottom perspective schematic exploded view of a movable diffuser according to one implementation.

FIG. 4A and FIG. 4B show an exploded view of an implementation of the movable diffuser 146. The images of FIG. 4A and 4B are simplified for illustrative purposes and are not depicted to scale. Movable diffuser 146 includes a body member 240, top plate 244, bottom plate 246, pivot mount 248, and upper section member 156. The body member 240 has a curved shape to allow the movable diffuser 146 to be placed in a stored position, as discussed previously with respect to FIG. 2. The body member 240 includes a top channel 252 and a bottom channel 254. The top channel 252 forms the arm process gas flow path 172 in the movable diffuser 146. The bottom channel 254 forms the arm exhaust flow path 190 in the movable diffuser 146. The deposition head 164 is located opposite the upper section member 156 and pivot mount 248. The top channel 252 is defined by top plate 244 and bottom surface 256. The top plate 244 is supported on a lip 260 on top channel side wall 262 when the top plate 244 and the body member 240 are connected in an assembled position to form top channel 252. A top channel opening 264 in the top channel 252 will couple with the housing process gas flow path 174 in the support housing 150 shown in FIG. 3A. The top channel 252 opens to the process gas chamber 194 and inlet openings 170 of the deposition head 164.

The bottom channel 254 is defined by bottom plate 246 and top surface 266. The bottom plate 246 is supported on a bottom channel lip (not shown) on bottom channel side wall 272 when the bottom plate 246 and the body member 240 are connected in an assembled position. A bottom channel opening 274 in the bottom channel 254 will couple with the housing exhaust flow path 210 in the annulus of the support housing 150 shown if FIG. 3A. The bottom channel 254 has exhaust openings 192 that open into the bottom channel 254.

The movable gas diffuser may be made from aluminum. In some implementations, the movable diffuser 146 may be made from ceramic materials such as quartz, silicon carbide, sapphire, silicon coated with silicon carbide, graphite coated with silicon carbide, graphite coated with glassy carbon, or metals including steel, nickel, or coated metals, or any other material which is stable with respect to the process environment.

During operation of the processing chamber 100, process gas is introduced into the process gas region 134 through the inlets of the showerhead 116 located on the face plate 106 and is flown over a substrate 102, which may be rotating in order to increase deposition uniformity. The process gas is thermally decomposed to deposit a material on the substrate 102. However, the process gas may not deposit uniformly over the substrate 102. For example, material deposition near the center of the substrate 102 may be greater than material deposition around the outside edge of the substrate 102. In such an example, the movable diffuser 146 may be utilized to provide additional process gas near the perimeter of the substrate 102 to increase the material deposition near the outer edge of the substrate 102. The additional process gas from the movable diffuser 146 may be provided prior to or subsequent to introduction of process gas from the showerhead 116 on the face plate 106.

In an implementation, the showerhead 116 on the face plate 106 acts as a primary gas distribution unit and the movable diffuser 146 acts as a secondary gas distribution unit. The primary gas distribution unit introduces process gas into the processing chamber 100 and the process gas is deposited on the substrate 102 in a first step. The substrate 102 is evaluated to determine whether the process gas has deposited uniformly over the substrate 102 and to identify any areas where the process gas has not been deposited uniformly. There may be a plurality of non-uniform substrate areas where the process gas has not deposited a uniform layer of process gas or there may be other irregularities or reasons additional process gas may need to be deposited on the selected substrate areas.

The controller 180 may be used to map the location of the selected substrate areas using a coordinate system. The coordinate system is used to identify the location of the selected substrate areas on the surface of the substrate 102. The coordinates of each selected area is stored in the controller 180 and the controller 180 includes a program designed to use the stored coordinates to direct the movable diffuser 146 to each separate location of the selected substrate areas. The movable diffuser 146 may function as a secondary gas distribution unit to deposit process gas on selected deposition areas of the substrate 102 that are not uniform or that have been detected to have other properties that would benefit from the deposition of additional process gas. The movable diffuser 146 is rotatable to a plurality of operational positions with the inlet openings 170 of the movable diffuser 146 being positioned over a different area of the substrate support 122 and substrate 102 that is supported for each of the operational positions. The movable diffuser 146 rotates to the selected area to place the deposition head 164 over the selected area. The controller 180 may then control the processing chamber 100 to flow process gas through the inlet openings 170 of the deposition head 164 into the selected area of the substrate 102. In an implementation, the controller 180 may also control the showerhead 116 of face plate 106 to flow purge gas over the substrate support 122 and substrate 102 during the flow of process gas through the deposition head 164. The flow of purge gas at this step of the process helps control the flow of process gas by the deposition head 164 to the selected area of the substrate 102.

In other implementations, the movable diffuser 146 may be used a primary gas distribution system. For example, the deposition head 164 is positioned over a substrate 102 in a first position and process gas is distributed onto areas of the substrate 102 disposed beneath the deposition head 164. The deposition head 164 is then rotated to a second position where the process of distributing process gas is repeated. These process steps may be repeated until the deposition head 164 has flowed process gas over the full surface area of the substrate 102.

Embodiments are adapted to provide uniform material deposition in processing chamber 100. A movable diffuser 146 positioned above a substrate 102 allows for corrections of deposition non-uniformity. The movement of the movable diffuser 146, as well as the flow of gas there through, is controlled by a controller 180 which allows for process repeatability. The increased deposition uniformity on the substrates 102 increases the quality of the substrates 102 and the efficiency of the final manufactured devices.

In operation, the processing chamber 100 may be operated in a repair operational mode where the movable diffuser 146 is used to deposit deposition material on selected deposition areas of the substrate 102. The processing chamber 100 also may be operated in a continuous operational mode where the movable diffuser 146 continuously deposits deposition material on a substrate 102. A substrate 102 is loaded into the chamber body 104 and is supported by the substrate support 122.

Figure 5:
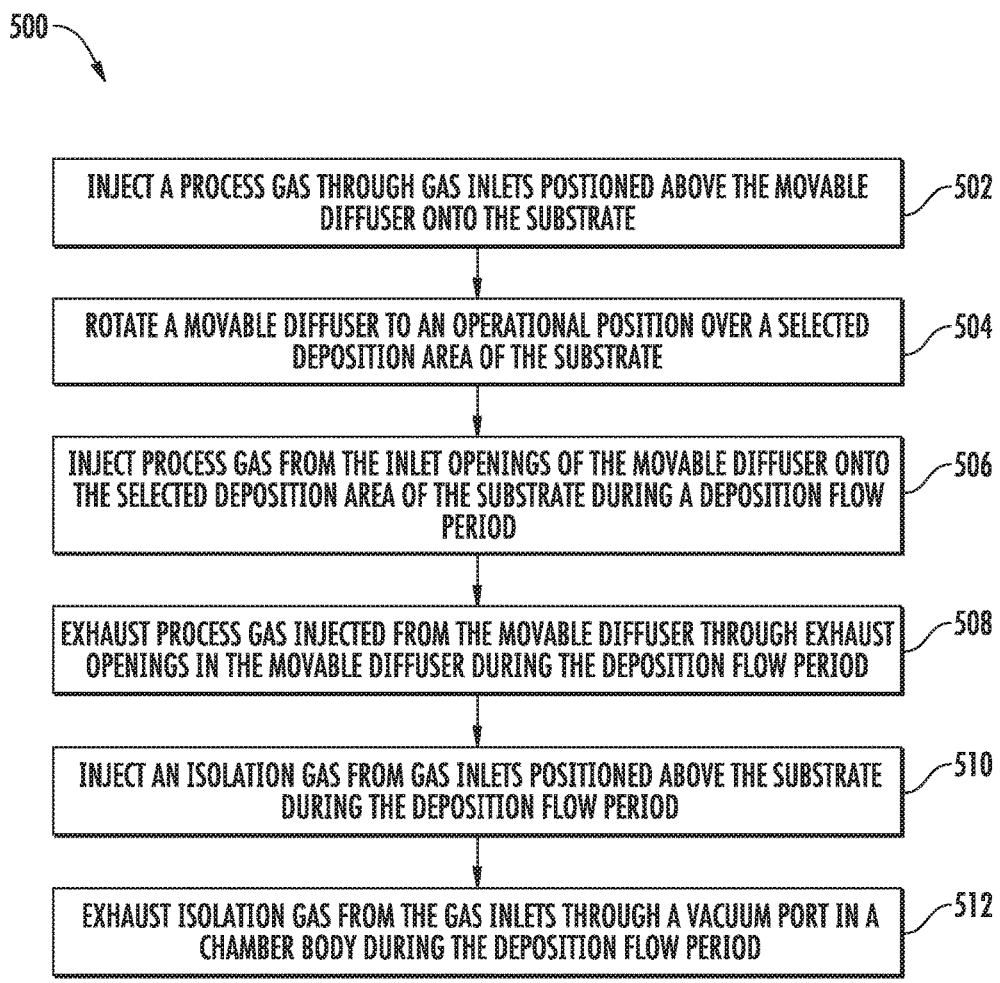
FIG. 5 is a flow chart of a repair operational mode for processing a substrate in a processing chamber according to some implementations.

FIG. 5 shows a flow chart 500 for the repair operational mode for a substrate 102 in the processing chamber 100. A process gas is injected in block 502 through gas inlets 120 positioned above the movable diffuser 146 onto the substrate 102. Process gas is injected into the process gas region 134 of the chamber body 104 through a plurality of gas inlets 120 of the showerhead 116 located above the substrate support 122. The movable diffuser 146 is positioned in the storage position, while process gas is flowing from the gas inlets 120 of the showerhead 116.

Process gas from the gas inlets 120 of the showerhead 116 forms a deposition layer on the substrate 102. The deposition layer also may be referred to as a deposition film. In some embodiments, the process gas from the gas inlets 120 of the showerhead 116 forms a base deposition layer on the substrate 102. The base deposition layer is the first deposition layer that the processing chamber 100 forms on the substrate 102 during deposition operations in the processing chamber 100. The introduction of the process gas into the process gas region 134 and onto the substrate 102 is controlled by the controller 180. The gas inlets 120 of the showerhead 116 act as primary gas distribution unit for the repair operational mode.

After the deposition layer has been formed on the substrate 102 by the showerhead 116, an inspection of the substrate 102 is performed. The inspection may identify one or a plurality of selected deposition areas of the substrate 102 where additional deposition material is desired. The inspection may identify an area of the substrate 102 where the deposition layer is not uniform. For example, material deposition near the center of the substrate 102 may be greater than the outside edge of the substrate 102. In such an example, the movable diffuser 146 may be utilized to provide additional process gas in selected deposition areas near the perimeter of the substrate 102 to increase deposition material near the outer edge of the substrate 102. In some embodiments, the inspection of the substrate 102 includes removing the substrate 102 from the processing chamber 100 and loading the substrate 102 into the processing chamber 100 after the inspection. In some embodiments, a substrate 102 reference notch on the substrate 102 is used for aligning the substrate 102 on the substrate support 122 after the inspection.

Location information of the selected deposition areas of the substrate 102 designated for the application of additional deposition material is inputted into the controller 180. The location information for a selected deposition area may include coordinates that identify the selected deposition area of the substrate 102. The selected deposition area is located on a portion of the surface of the substrate 102. In some embodiments, the selected deposition area is a size that corresponds to the size of the diffuser showerhead 166 of the deposition head 164. The selected deposition area may be referenced with respect to a substrate reference notch. The location information can identify the selected deposition area with respect to the substrate reference notch.

A deposition characteristic may be determined for a selected deposition area. In some embodiments, the deposition characteristic is based at least in part on the inspection. In other embodiments, the deposition characteristic may be based on information from the processing of one or more substrates 102 in the processing chamber 100. For example, the deposition characteristic may correspond to the thickness of the deposition layer on the substrate 102. In this example, the amount of deposition material to be deposited on the selected deposition area by the movable diffuser 146 is determined based on the deposition characteristic. In some embodiments, a deposition characteristic is inputted into the controller 180 for the selected deposition area. The controller 180 may store a plurality of deposition characteristics for each selected deposition area.

To repair the substrate 102 after the inspection process, the controller 180 controls both the movable diffuser 146 and the substrate support 122 to position the deposition head 164 over a selected deposition area of the substrate 102. The selected deposition area is the area of the substrate 102 disposed below the inlet openings 170 of the diffuser showerhead 166. The movable diffuser 146 is rotated in block 504 to an operational position over a selected deposition area of the substrate 102. The movable diffuser 146 is rotated from the storage position to a position over a selected deposition area of the substrate 102. The controller 180 uses the location information for the selected deposition area to control the movement of the movable diffuser 146 and the rotation of the substrate support 122. More specifically, the controller 180 sends a signal to the movable diffuser actuator 162 to rotate the movable diffuser 146 or sends a signal to substrate support actuator 130 to rotate the substrate support 122 such that the deposition head 164 is positioned over the selected deposition area. The controller 180 may control the movement both of, or only one of, the movable diffuser 146 and the substrate support 122 to position the deposition head 164 over the selected deposition area.

The deposition head 164 is positioned above the selected deposition area. Process gas is injected in block 506 from the inlet openings 170 of the movable diffuser 146 onto the selected deposition area of the substrate during a deposition flow period. The deposition flow period is a time period for injecting process gas from the deposition head 164 to the selected deposition area. The deposition head 164 injects process gas to the selected deposition area during the deposition flow period. The deposition flow period is calculated such that an amount of process gas is injected from the deposition head 164 to deposit a deposition layer on the selected deposition area. The deposition layer deposited by the deposition head may be referred to as a repair deposition layer. The repair deposition layer may correspond with a deposition characteristic associated with the selected deposition area. For example, the deposition characteristic may correspond to a selected deposition thickness for the diffuser deposition layer. In some embodiments, the substrate support 122 is controlled by the controller 180 to remain stationary during the deposition flow period.

When the movable diffuser 146 is positioned over the selected deposition area and during the deposition flow period, the controller 180 controls process gas flow through the inlets of the deposition head 164, exhaust through the exhaust openings 192 in the deposition head 164, and isolation gas through the gas inlets 120 of the showerhead 116. More specifically, the controller 180 controls the diffuser process gas supply 176 to supply process gas to the deposition head 164 of the movable diffuser 146 during the deposition flow period. The process gas flows to the deposition head 164 from the diffuser process gas supply 176 through the housing process gas flow path 174 in the support housing 150 and the arm process gas flow path 172 in the movable diffuser 146. The process gas is injected through the inlet openings 170 of the deposition head 164 at a velocity sufficient for the process gas to flow against the selected deposition area of the substrate 102 underlying the inlet openings 170.

The controller 180 controls the vacuum pump 142 to apply a vacuum to exhaust openings 192 to provide exhaust for the process gas in the process gas region 134 above the selected deposition area. Process gas is exhausted in block 508 from the movable diffuser 146 through exhaust openings 192 in the movable diffuser 146 during the deposition flow period. The process gas that flows through the exhaust openings 192 includes reacted process gas, which is process gas that has interacted with the substrate 102 to deposit deposition material on the substrate 102. Reacted process gas may be referred to as exhaust or effluent. During the deposition flow period, the exhaust flows into the exhaust openings, through the arm exhaust flow path 190 in the movable diffuser 146, through the housing exhaust flow path 210 of the support housing 150, and to the vacuum pump 142.

The exhaust flow through the exhaust openings 192 of the deposition head 164 functions to exhaust the process gas above the selected deposition area. The exhaust flow through the deposition head 164 reduces the amount of process gas that is deposited on the substrate 102 in areas of the substrate 102 that are outside of the selected deposition area. More specifically, process gas is injected from the inlet openings 170 of the deposition head 164 and reacts with the selected substrate area underlying the deposition head 164 to produce reacted process gas. The vacuum at the outlets of the deposition head 164 pulls the reacted process gas through the exhaust openings 192 and into the arm exhaust flow path 190 to remove the reacted process gas. The positioning of the exhaust openings 192 to surround the inlet openings 170 of the deposition head 164 provides the benefit of removing the reacted process gas at the location of the deposition head 164. The exhaust openings 192 of the deposition head 164 reduces the amount of reacted process gas that flows to areas of the substrate 102 outside of the selected deposition area.

The controller 180 controls the gas panel 136 to supply isolation gas to the gas inlets 120 of the showerhead 116 and face plate 106. Isolation gas is injected in block 510 from gas inlets 120 positioned above the substrate 102 during the deposition flow period. During the deposition flow period, isolation gas is injected by the showerhead 116 into the process gas region 134 above the substrate 102. The isolation gas from the showerhead 116 functions to isolate the process gas to the selected deposition area disposed below the deposition head 164. The isolation gas from the showerhead 116 and the exhaust flow through the deposition head 164 provide the benefit of reducing the amount of process gas, including reacted process gas, flowing to in areas of the substrate 102 that are outside of the selected deposition area. Isolation gas from the gas inlets 120 is exhausted in block 512 through a vacuum port 140 in the chamber body 104 during the deposition flow period. The isolation gas from the showerhead 116 of the face plate 106 is exhausted at vacuum port 140 of the chamber body 104 and a portion of the isolation gas may be exhausted through the exhaust openings 192 of the deposition head 164.

At the end of the deposition flow period, the controller 180 controls the diffuser process gas supply 176 to shut-off and stop the supply of process gas to the deposition head 164. In some embodiments, the controller 180 controls the gas panel 136 to shut-off and stop the supply of the isolation gas to the gas inlets 120 of the showerhead 116 at a time before the deposition head 164 is moved to a different selected deposition area. In other embodiments, the flow isolation gas continues as the deposition head 164 moves from one selected deposition area to another selected deposition area. In some embodiments, the controller 180 controls the vacuum pump 142 to shut-off the vacuum pump 142 to discontinue the exhaust flow through the exhaust openings 192 and vacuum port 140 the deposition head 164 before the deposition head 164 moves from one selected deposition area to another selected deposition area. In other embodiments, the vacuum pump 142 continues operation to produce exhaust flow through the deposition head 164 as the deposition head 164 moves from one selected deposition area to another selected deposition area.

In some embodiments, the movement of the movable diffuser 146 by the controller 180 may be based upon location information and deposition characteristics. The processing chamber 100 and movable diffuser 146 may be operated in the repair operational mode to repair a plurality of selected deposition areas. For example, the deposition head 164 may be used to inject deposition material on a first selected deposition area. The movable diffuser 146 then is rotated to move the deposition head 164 to a second selected deposition area where the deposition head 164 injects substrate material on the second selected deposition area. In some embodiments, the deposition head 164 is positioned over one of the selected deposition areas a plurality of different times. The deposition head 164 may be moved to a multiple of selected deposition areas by the controller 180 when being operated in the repair operational mode. The movable diffuser 146 may be positioned over a selected deposition area by rotating the movable diffuser 146 or by rotating the substrate support 122.

For the continuous operational mode, location information and deposition characteristic information is loaded into the controller 180. The location information and the deposition characteristic information provides deposition profile information that defines the deposition layer to be formed on the substrate 102. For example, the deposition characteristic information may include the thickness of the deposition layer to be deposited on the substrate 102. The thickness of the deposition layer may vary at different locations on the substrate 102. The location information and deposition characteristic information may be developed by experimentation.

For the continuous operational mode, a substrate 102 is loaded into the chamber body 104 and is supported by the substrate support 122. The controller 180 controls the substrate support actuator 130 of the substrate support 122 to rotate the substrate 102 and the movable diffuser actuator 162 to rotate the deposition head 164. The deposition head 164 is positioned over a selected deposition area of the substrate 102 at a starting location. The controller 180 operates the deposition head 164 as described with respect to the repair operational mode to deposit a deposition layer on a first selected deposition area of the substrate 102 during deposition flow period.

The movable diffuser 146 is used as a primary gas distribution unit in the continuous operational mode. The movable diffuser 146 replaces the gas inlets 120 of the face plate 106 as the primary gas distribution unit when the processing chamber 100 uses the continuous operational mode. The movable diffuser 146 functions to deposit a base deposition layer on the substrate 102. The base deposition layer is the first layer that is deposited on the substrate 102 by processing chamber 100.

After depositing deposition material on the first selected deposition area, the controller 180 controls the movement of the movable diffuser 146 and substrate support 122 to position the deposition head 164 to a second selected deposition area of the substrate 102. The controller 180 operates the deposition head 164 as described with respect to the repair operational mode to deposit a deposition layer on the second selected deposition area of the substrate 102 during a deposition flow period. In the continuous operational mode, the deposition head 164 continues to move to different selected deposition areas to provide a deposition layer on the substrate 102 that corresponds to the deposition profile for the substrate 102. In some embodiments of the continuous operational mode, the deposition head 164 is used to deposit a substrate layer that corresponds to the deposition profile for the substrate 102 as a whole, and not only to a portion of the substrate 102 designated to need additional deposition material to repair a non-uniformity in the deposition layer.

In some embodiments of the continuous operational mode, the controller 180 controls the movable diffuser 146 to continuously inject deposition material from the deposition head 164 as the deposition head 164 moves from one selected deposition area to another deposition area. The controller 180 controls the rate of rotation of substrate support 122 and the substrate 102, the rate of rotation of the movable diffuser 146, and the rate of injection of deposition material from the deposition head 164 to control the amount of deposition material deposited on the selected deposition areas. A continuous deposition layer is formed on the substrate 102 as the deposition head 164 moves over the substrate 102. In some embodiments of the continuous operational mode, process gas is continually injected from the inlet openings 170 of the deposition head 164 as the movable diffuser 146 moves over different selected deposition areas of the substrate 102 as the substrate 102 rotates. In some embodiment, for example, the process gas is continually injected from the inlet openings 170 as the movable diffuser 146 makes a complete path or a path that travels 360 degrees around the substrate 102. In another example, the process gas is continually injected from the inlet openings 170 as the movable diffuser 146 radially rotates along an arc path 188 for the movable diffuser 146.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber for processing a substrate, comprising:
    a chamber body including a processing chamber interior having a vacuum port;
    a substrate support disposed within the chamber body and adapted to support the substrate thereon;
    a plurality of gas inlets positioned above the substrate support to direct a process gas above the substrate support; and
    a movable diffuser pivotally mounted adjacent to the substrate support via a pivoting mount, the movable diffuser comprising a deposition head having a plurality of inlet openings for directing process gas toward the substrate support and a plurality of exhaust openings for providing an exhaust to process gas disposed above the substrate support by the movable diffuser, wherein the deposition head is movable to a plurality of positions on an arc path between a perimeter of the substrate support and a center of the substrate support, wherein the movable diffuser includes an arm exhaust flow path coupled to the plurality of exhaust openings, and wherein the arm exhaust flow path is coupled to the processing chamber interior and the vacuum port.

2. The processing chamber of claim 1, wherein the plurality of exhaust openings are disposed around the plurality of inlet openings of the deposition head.

3. The processing chamber of claim 1, wherein the deposition head is disposed at an end of the movable diffuser opposite the pivoting mount.

4. The processing chamber of claim 1, wherein the plurality of gas inlets are disposed in a lid assembly for the chamber body.

5. The processing chamber of claim 1, wherein the chamber body has a top opening having a top opening perimeter, wherein the movable diffuser has a stored position where the movable diffuser is positioned outside of the top opening perimeter.

6. The processing chamber of claim 1, wherein the plurality of gas inlets is disposed over the substrate support, and wherein the movable diffuser is rotatable to an operational position where the movable diffuser is positioned between the plurality of gas inlets and the substrate support.

7. The processing chamber of claim 1, further comprising a support housing located in the chamber body, wherein the support housing includes a housing process gas flow path coupled to the plurality of inlet openings of the deposition head and a housing exhaust flow path coupled to the plurality of exhaust openings of the deposition head.

8. A processing chamber, comprising:
    a chamber body;
    a substrate support disposed within the chamber body and adapted to support a substrate thereon;
    a plurality of gas inlets positioned above the substrate support to direct a process gas above the substrate support; and
    a movable diffuser mounted adjacent to the substrate support, the movable diffuser having a deposition head, an elongated curved section, and an arm process gas flow path leading to a plurality of inlet openings in the movable diffuser for directing process gas toward the substrate support wherein the movable diffuser is rotatable to a plurality of operational positions with the plurality of inlet openings of the movable diffuser being positioned over a different area of the substrate support for each of the plurality of operational positions, and wherein the deposition head of the movable diffuser is movable to a plurality of positions on an arc path between a perimeter of the substrate support and a center of the substrate support.

9. The processing chamber of claim 8, wherein the movable diffuser further comprises a plurality of exhaust openings in the movable diffuser and an arm exhaust flow path coupled to the plurality of exhaust openings.

10. The processing chamber of claim 9, wherein the chamber body includes a channel in the chamber body, wherein the chamber body comprises a housing exhaust flow path in the channel of the chamber body coupled to the arm exhaust flow path of the movable diffuser.

11. The processing chamber of claim 8, wherein the chamber body has a top opening, and wherein the movable diffuser is rotatable to a storage position where the movable diffuser is disposed outside of the top opening of the chamber body.

12. The processing chamber of claim 9, wherein the plurality of exhaust openings are disposed around the plurality of inlet openings of the movable diffuser.

13. The processing chamber of claim 9, further comprising a support housing located in the chamber body, wherein the support housing includes a housing process gas flow path coupled to the plurality of inlet openings and a housing exhaust flow path coupled to the plurality of exhaust openings.

14. A processing chamber for processing a substrate, comprising:
    a chamber body including a processing chamber interior having a vacuum port;

a substrate support disposed within the chamber body and adapted to support the substrate thereon;

a plurality of gas inlets positioned above the substrate support to direct a process gas above the substrate support; and a movable diffuser pivotally mounted adjacent to the substrate support via a pivoting mount, the movable diffuser comprising an elongated curved section and a deposition head having a plurality of inlet openings for directing process gas toward the substrate support and a plurality of exhaust openings for providing an exhaust to process gas disposed above the substrate support by the movable diffuser, wherein the deposition head is movable to a plurality of positions on an arc path between a perimeter of the substrate support and a center of the substrate support, wherein the movable diffuser includes an arm exhaust flow path coupled to the plurality of exhaust openings, and wherein the arm exhaust flow path is coupled to the processing chamber interior and the vacuum port.

15. The processing chamber of claim 14, wherein the plurality of exhaust openings are disposed around the plurality of inlet openings of the deposition head.

16. The processing chamber of claim 14, wherein the deposition head is disposed at an end of the movable diffuser opposite the pivoting mount.

17. The processing chamber of claim 14, wherein the chamber body has a top opening having a top opening perimeter, wherein the movable diffuser has a stored position where the movable diffuser is positioned outside of the top opening perimeter.

18. The processing chamber of claim 14, further comprising a support housing located in the chamber body, wherein the support housing includes a housing process gas flow path coupled to the plurality of inlet openings and a housing exhaust flow path coupled to the plurality of exhaust openings.

* * * * *